US006889357B1

(12) United States Patent
Keeth et al.

(10) Patent No.: US 6,889,357 B1
(45) Date of Patent: May 3, 2005

(54) TIMING CALIBRATION PATTERN FOR SLDRAM

(75) Inventors: Brent Keeth, Boise, ID (US); Brian Johnson, Boise, ID (US); Terry R. Lee, Boise, ID (US); Paul M. Fuller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/568,155

(22) Filed: May 10, 2000

(51) Int. Cl.[7] ............................. G11B 27/00; H04L 7/00
(52) U.S. Cl. ....................................... 714/814; 713/401
(58) Field of Search ................................ 714/814, 815, 714/700, 798, 811, 701, 738, 739, 744; 713/400, 401, 500, 502, 600

(56) References Cited

U.S. PATENT DOCUMENTS

| 5,841,580 | A | 11/1998 | Farmwald et al. |
| 5,917,760 | A | 6/1999 | Millar |
| 5,953,263 | A | 9/1999 | Farmwald et al. |
| 6,016,282 | A | 1/2000 | Keeth |
| 6,035,365 | A | 3/2000 | Farmwald et al. |
| 6,038,195 | A | 3/2000 | Farmwald et al. |
| 6,067,592 | A | 5/2000 | Farmwald et al. |
| 6,101,152 | A | 8/2000 | Farmwald et al. |
| 6,298,465 | B1 | * 10/2001 | Klotchkov .................. 714/814 |
| 6,336,192 | B1 | * 1/2002 | Sakamoto et al. .......... 713/503 |
| 6,446,180 | B2 | * 9/2002 | Li et al. ...................... 711/167 |
| 6,636,999 | B1 | * 10/2003 | Yamada ...................... 714/744 |

OTHER PUBLICATIONS

Gillingham; "SLDRAM Architectural and Functional Overview"; SLDRAM Consortium, Aug. 29, 1997, pp. 1–14.

* cited by examiner

*Primary Examiner*—Christine T. Tu
(74) *Attorney, Agent, or Firm*—Dickstein Shapiro Morin & Oshinsky LLP

(57) ABSTRACT

Disclosed is an improved start-up/reset calibration apparatus and method for use in an SLDRAM memory device A $2^N$ bit calibration pattern which is based on a pseudo random sequence is used to calibrate the relative timing of data and a latching clock signal to ensure optimal operation of the memory device. In addition, during calibration of one data path, other nearby data paths may receive in phase, out of phase and/or both in phase and out of phase versions of the calibration pattern so that the data path under calibration is calibrated under conditions which more closely approximate random operating conditions.

94 Claims, 6 Drawing Sheets

TIMING CALIBRATION PATTERN FOR SLDRAM

FIELD OF THE INVENTION

The present invention relates to an improved binary calibration pattern which is useful for calibrating timing of control and data signals in SLDRAM memory devices.

DISCUSSION OF THE RELATED ART

Memory devices are constantly evolving in the directions of faster speed and higher memory density. To this end, dynamic random access memory (DRAM) devices have evolved from simple DRAM devices to EDO to SRAM to DDR SDRAM to SLDRAM, the latter of which is the subject of much current industry interest. SLDRAM has a high sustainable bandwidth, low latency, low power, user upgradability and support for large hierarchical memory applications. It also provides multiple independent banks, fast read/write bus turn-around, and the capability for small fully pipelined burst.

One characteristic of SLDRAM is that it uses both the positive- and negative-going edges of a clock cycle to READ and WRITE data to the memory cells and to receive command and FLAG data from a memory controller.

An overview of SLDRAM devices can be found in the specification entitled "SLDRAM Architectural and Functional Overview," by Gillingham, 1997 SLDRAM Consortium (Aug. 29, 1997), the disclosure of which is incorporated by reference herein.

Because of the required high speed operation of SLDRAM, and other contemporary memory devices, system timing and output signal drive level calibration at start-up or reset is a very important aspect of the operation of such devices to compensate for wide variations in individual device parameters.

One of the several calibration procedures which is performed in current SLDRAM devices is a timing synchronization of clock signals CCLK (command clock signal) and DCLK (data clock signal) with data provided on an incoming command path CA and FLAG path (for the CCLK signal) and on the data paths DQ (for the DCLK signal) so that incoming data is correctly sampled. Currently, a memory controller achieves this timing calibration at system initialization by sending continuous CCLK and DCLK transitions on those clock paths and transmitting inverted and non-inverted versions of a 15 bit repeating pseudo random SYNC sequence "111101011001000" on each of the data paths DQ, the command path CA, and the FLAG path. The SLDRAM recognizes this pseudo random sequence by two consecutive ones "1" appearing on the FLAG bit and determines an optimal relative internal delay for CCLK and DCLK to optimally sample the known bit pattern. This optimal delay is achieved by adjusting the position of the received data bits to achieve a desired bit alignment relative to the clock. This is accomplished by adjusting a delay in the receiving path of the received data until the received data is properly sampled by the clock and recognized internally. Once synchronization has been achieved, that is, the proper delays on the data receiving paths have been set, the memory controller stops sending the SYNC pattern and the SLDRAM, after all calibrations are completed, can be used for normal memory READ and WRITE access.

While the timing calibration described above, which is conducted at start-up and reset, has been found to perform adequately in most circumstances, there is a problem in that current SLDRAM devices capture incoming data on both positive and negative going transitions of the clock signals CCLK and DCLK. As a consequence, even when timing calibration is achieved it is not clear if alignment was achieved on a positive going or negative going clock edge. That is, the 15-bit synchronization pattern lacks any timing signature. It would be preferable to always align the data timing on one of the positive or negative going edges, e.g., the positive going edge, to simplify the command bit logic circuit. If circuit designers simplify the command bit logic circuit on the assumption that alignment is achieved on one of the positive and negative going edges, e.g., positive going edge, of the clock signal, achieving timing synchronization using the current 15 bit pseudo random pattern cannot guarantee that synchronization was achieved with respect to the correct, e.g., positive going, clock edge. If, for example, synchronization was achieved on the negative going edge of a clock signal when the circuitry is designed on the assumption that synchronization is achieved on a positive going edge, when data is later sampled during memory access the data sampling may be off by one bit. Moreover, because the 15-bit pseudo random pattern is repeated during the calibration process, there will be alternating times when it is properly synchronized on the correct clock transition, e.g., positive going, and then improperly synchronized with, e.g., a negative going transition, and there is no mechanism for knowing when the calibration process is completed, whether synchronization has been achieved in the positive or negative going transition of the clock. Thus, calibration may be achieved in the wrong phase of the clock signal, leading to incorrect sampling of the data during memory access operations, or requiring additional complicated circuitry to ensure that incoming data is synchronized to the proper phase of the clock.

Another weakness of the 15-bit synchronization pattern is associated with how calibration is carried out. When one data path is calibrated, an inverted version of the 15-bit pattern is delivered to pins/data paths adjacent to the data path being calibrated so that calibration can occur in the presence of out-of-phase cross talk on adjacent paths. However, only out-of-phase cross talk calibration is achieved for any given data path.

SUMMARY OF THE INVENTION

The present invention is designed to overcome the possibility of achieving synchronization on an undesired phase of the data clock. To this end the invention provides a $2^N$ bit synchronization pattern which, because it has an even number of bits, will ensure that incoming data synchronization is always achieved in a desired phase of the associated clock. The synchronization pattern is preferably a $2^N$ bit pattern which is achieved by adding an additional bit to a $2^N 31\ 1$ pseudo random bit pattern. The synchronization bit pattern employed in the invention is also preferably 16 bits long.

In addition, during calibration of one data path, adjacent data pins and/or data paths are fed with both in phase and out of phase versions of the $2^N$ bit calibration pattern so that calibration operations take place in the presence of both in phase and out of phase cross talk on adjacent data pins and/or paths.

BRIEF DESCRIPTION OF THE DRAWINGS

The above and other advantages and features of the invention will be more clearly understood from the following detailed description of the invention which is provided in connection with the accompanying drawings in which.

DETAILED DESCRIPTION OF THE PREFERRED EMBODIMENTS

Figure 1:
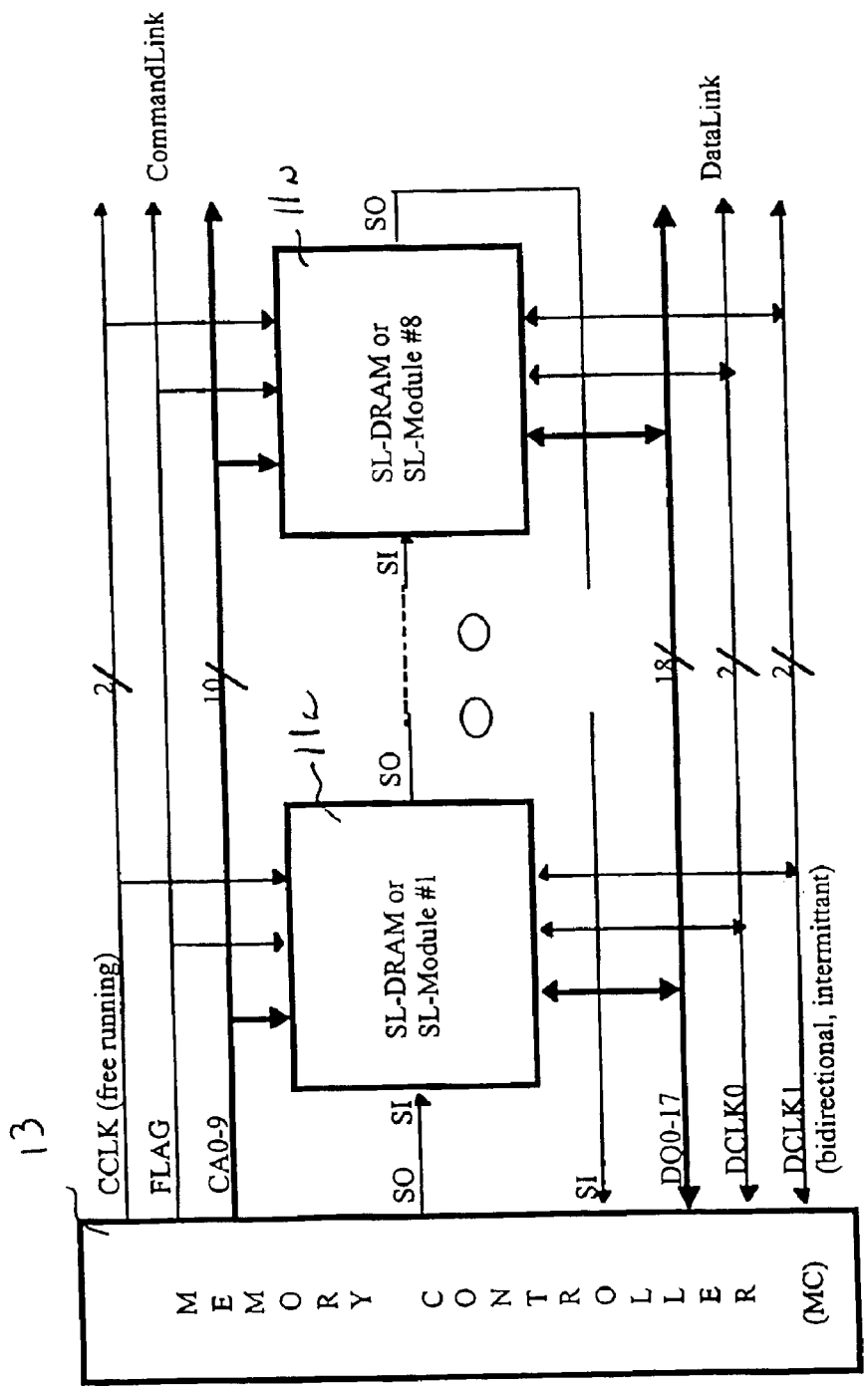
FIG. 1 illustrates an SLDRAM bus topology with which the invention is used.

A SLDRAM system which employs the invention is illustrated in FIG. 1. It includes a plurality of SLDRAM modules 11a ... 11n which are accessed and controlled by a memory controller 13. Memory controller 13 provides a command link to each of the SLDRAM modules 11a ... 11n in which includes a clock signal CCLK on inverted and non-inverted clock signal paths, a 1 bit FLAG signal and a 10 bit command bus CA0-9. In addition, SLDRAM input/output signals SO, SI are provided from memory controller is in daisy chain fashion to the SLDRAM modules 11a ... 11n. In addition, a bi-directional data bus DQ0-17 is provided between memory controller 13 and each of the SLDRAM modules 11a ... 11n, as are bi-directional data clocks DCLK0 and DCLK1. The clock DCLK0 is used to strobe input/output data into and out of the SLDRAM modules, a process for which the DCLK1 signal path is also intermittently used.

Figure 2:
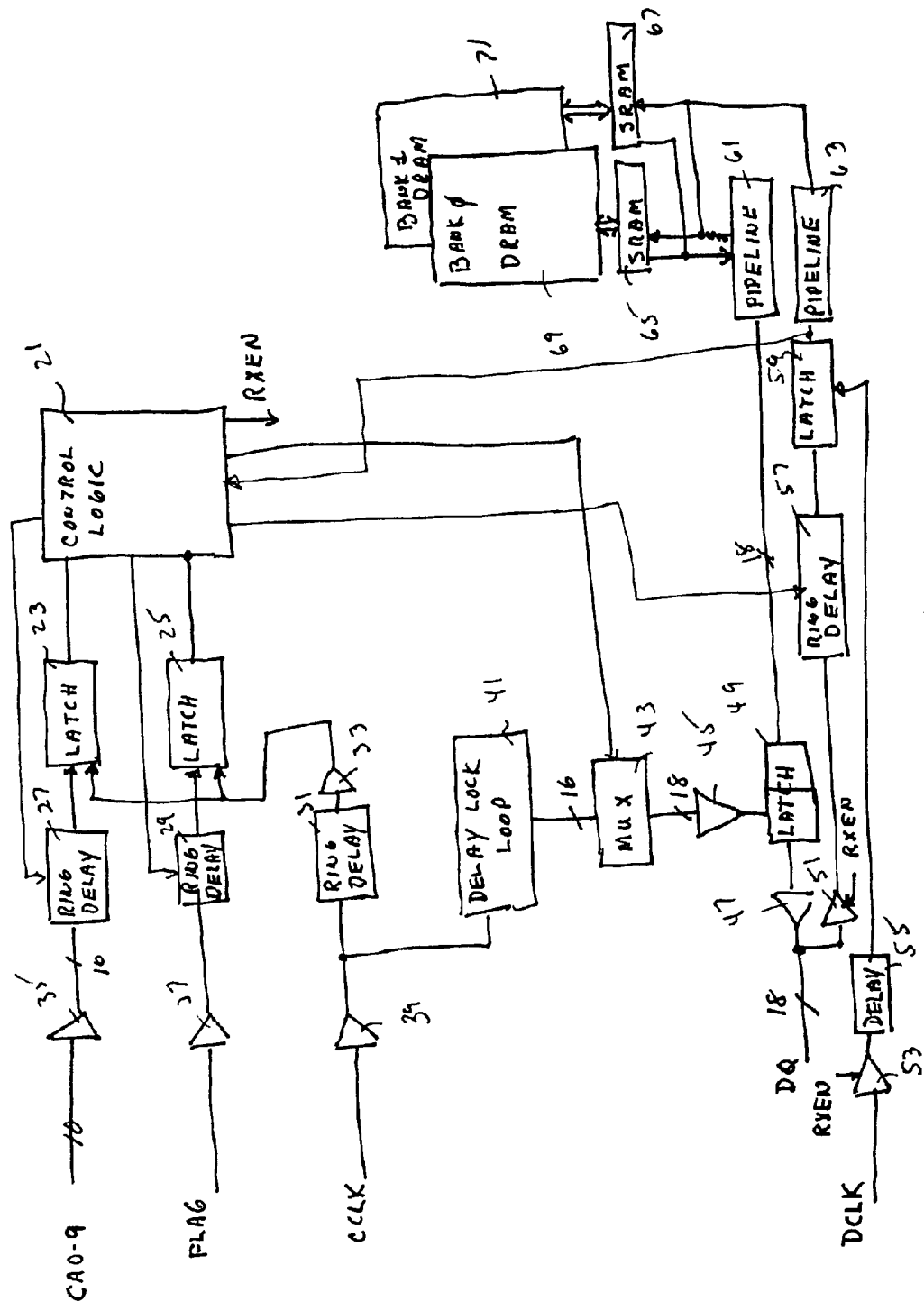
FIG. 2 illustrates a portion of the SLDRAM module shown in FIG. 1.

FIG. 2 illustrates a simplified relevant portion of one of the SLDRAM modules 11a ... 11n. It includes a control logic circuit 21, latches 23, 25, 49, 59, delay devices 27, 29, 31, 55, 57 which may be ring delay devices, buffers 35, 37, 39, 33, 45, 47, 51, 53, a delay lock loop 41, multiplexer 43, pipeline circuits 61, 63, SRAM input/output circuits 65 and 67, and respective memory banks Bank0 and Bank1 69, 71. It should be noted that although two memory banks are illustrated in FIG. 2, this is just illustrative, as any number of memory banks can be used.

Control logic circuit 21 receives and analyzes commands on the CA0-9 bus and controls the input/output (I/O) access operations of the memory banks 69, 71. The control logic circuit 21 also receives the FLAG signal and the clock signal CCLK.

The signals on each of the command bus paths CA0-9 are passed through respective adjustable ring delay circuits 27 and into respective latches 23 where the signals are latched by a CCLK signal, as buffered by buffer 39, delayed by delay 31 and buffered by buffer 33.

The signal CCLK also passes from buffer 39 into a delay lock loop circuit 41 which provides 16 clock signals into a multiplexer 43. The multiplexer provides 18 clock output signals through respective buffers 45 to 18 latches 49 which latch data output from the memory banks 69, 71. The output data from memory banks 69, 71 pass into SRAMS 65, 67 which act as I/O buffers and pass through pipeline circuit 61 before being loaded into latches 49. The output data latched in latches 49 is provided to respective buffer amplifiers 47 and from there is passed back to memory controller 13 via data bus DQ.

Data which is to be input to memory banks 69, 71 is supplied by memory controller 13 on the DQ data bus, is passed through gated buffers 51 through ring delays 57 on each path of the data bus, into latches 59, through pipeline circuit 63. From pipeline circuit 63, input data on the DQ bus passes into buffer SRAM 65, 67 and into a memory bank 69, 71.

The control logic circuit 21 also issues an enable command RXEN whenever the memory controller indicates a memory access WRITE operation by way of a WRITE command in the data on the command bus CA0-9. The RXEN command enables the data input buffers 51 and a data clock input buffer 55. The data clock DCLK passes through gated buffer 55, delay circuit 55 and is used to control latch 59 to latch in incoming data on the data bus DQ.

In order to ensure proper timing of the various memory operations performed by the SLDRAM modules 11a ... 11n, the FIG. 2 circuit must be synchronized to ensure the incoming data is properly clocked in by the clock signals CCLK and DCLK. To this end, and in accordance with the invention, a $2^N$ bit synchronizing pattern is applied to each of the data input paths CA0-9 and FLAG while the data pattern is sampled in latches 23 and 25 by the delayed clock signal CCLK. The control logic circuit 21 steps through all possible delay positions of ring delays 27 and 29 as the data sampling is performed and stores patterns representing which delay values for the ring delays 27 and 29 provide for a correct sampling and recognition of the $2^N$ bit pattern. In this manner, control logic circuit 21 establishes an "eye" or "window" of acceptable delays for each of the ring delays 27 for the command data paths CA0-9 and for ring delay 29 for the FLAG input path. Once a "window" of acceptable delays is found for each of the ring delays 27 and for the ring delay 29, the control logic circuit 21 determines the "best" delay value as that value which is approximately in the middle of the window.

Figure 3:
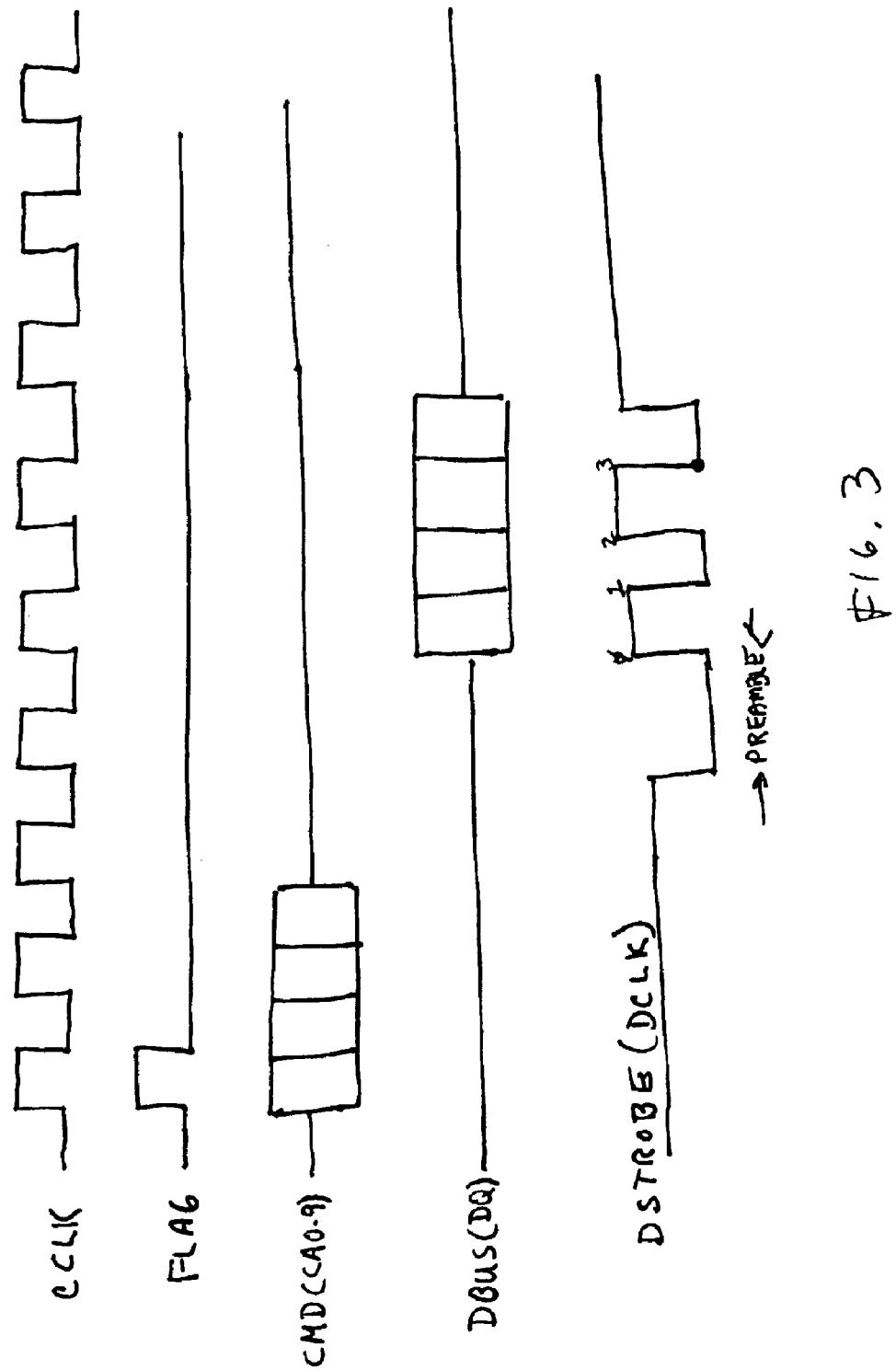
FIG. 3 illustrates a simplified timing diagram illustrating a portion of the timing signals used in the operation of the FIG. 2 circuit.

To illustrate the calibration process we will discuss calibration of the data appearing on the FLAG path, it being understood that the same calibration process is also carried out on each path of the command bus CA0-9 and each receive path of the data bus DQ. FIG. 3 illustrates a simplified timing diagram of the clock signal CCLK, the FLAG signal, the command bus signal CMD, a data bus signal DQ/DBUS and a data strobe signal DCLK. As shown, four bits of data on a DQ path of the data bus (DBUS) are clocked in on four sequential positive and negative going transitions of the data clock signal DCLK after an initial PREAMBLE portion of DCLK appears. The data present on the command signal paths CA0-9 and on the FLAG path is clocked in by the command clock signal CCLK.

Returning to FIG. 2, it can be seen that the data entering on the FLAG signal path passes through ring delay circuit 29 and is latched in latch 25 by the command clock signal CCLK. This data is then serially applied to control logic circuit 21. During the calibration period, and in accordance with the invention, a known $2^N$ bit synchronization pattern is applied to the FLAG path by memory controller 13 (FIG. 1), together with the free running clock signal CCLK. The control logic circuit knows what the $2^N$ bit calibration pattern is as it is stored and/or generated therein, and reads the repeating pattern bit-by-bit from latch 25. When doing so, the control logic circuit 21 first sets ring delay 29 for the FLAG path to one known delay setting. The control logic circuit 21 then examines the bit pattern sequentially received from latch 25 to see if it matches the known synchronization bit pattern. If the timing of the synchronization pattern data on the FLAG path is not aligned with the transitions of the CCLK signal, the correct bit pattern is not recognized at the output of latch 25 and the control logic circuit 21 will adjust ring delay 29 to the next delay setting, offset by a given amount from the prior delay setting of ring delay 29. Control logic circuit 21 will again continue to examine the synchronization pattern emerging from latch 25 to see if it matches the synchronization bit pattern. If not, it continues to increment the delay value of the ring delay 29 and repeat the sampling and examination process until the correct $2^N$ bit is recognized. In actuality, rather than stopping the calibration process when the correct synchronization bit pattern is recognized at the output of latch 25, the control logic circuit 21 will actually step through all possible delay values of ring delay 29 and keep track of which delays produced a proper recognition of the $2^N$ bit synchronization pattern. Then the control logic circuit 21 will select as a final delay value for ring delay 29, that value which is approximately centered between all delay values which produced a proper recognition of the $2^N$ bit synchronization pattern.

Figure 4:
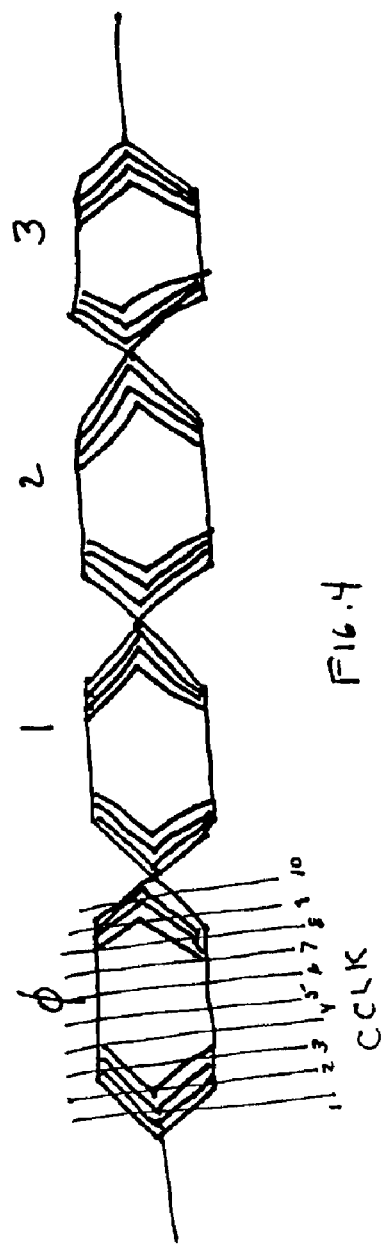
FIG. 4 illustrates a graphic example of the synchronization technique used to synchronize the SLDRAM system of FIG. 1.
Figure 5:
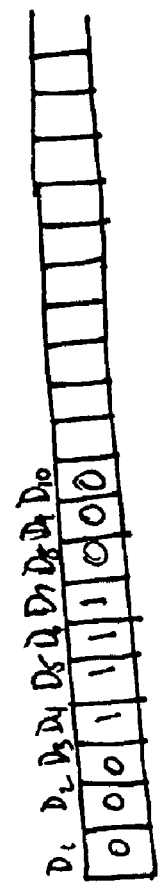
FIG. 5 illustrates a pattern of acceptable delay values for synchronization used in the invention.

FIG. 4 illustrates the data envelope for consecutive bits of the $2^N$ bit synchronization pattern together with the clock signals CCLK which latch the data in latch 25. The relative timing of the data envelope and the control data clock CCLK is illustrated as ten possibilities CCLK 1 . . . 10, that is, ten possible delay values for ring delay 29. The beginning and end of the data envelope is where the data on the FLAG path is unstable which can lead to erroneous sampling of the data. As shown, reliable data capture occurs at the relative timing location $C_4$ through $C_7$, while unreliable data capture occurs at the relative timing locations $C_1$ . . . $C_5$ and $C_8$ . . . $C_{10}$. These are represented within control logic circuit 21 as delay values $D_4$ . . . $D_7$, where the $2^N$ bit synchronizing pattern was properly recognized. FIG. 5 illustrates how this is represented in control logic circuit 21 where delay values $D^1$ . . . $D_5$ and $D_8$ . . . $D_{10}$ show a "0" logic state representing that the $2^N$ bit synchronization pattern was not recognized and the logic state "1" for delay values $D_4$ . . . $D_7$, indicating a proper recognition of the $2^N$ bit synchronization pattern. It should be understood that although only 10 relative delay states of the data to the command clock signal CCLK are shown for simplicity, in actual practice there may be many more possible delay stages for ring delay 29 and the logic state pattern illustrated in FIG. 5.

Once the delay state pattern shown in FIG. 5 is developed by control logic circuit 21, it selects as a final delay for ring delay 29 a delay value which is approximately in the center of those delay values, e.g., $D_4$ . . . . $D_7$, which produced a proper recognition of the $2^N$ bit synchronization pattern. In the example illustrated, the final delay would be selected as $D_5$ or $D_6$. Once this value is set for ring delay 29, the FLAG data path has been calibrated.

The same calibration procedure is also applied to each of the CMD data paths CA0-9 and to each of the data paths of the DQ bus, except for the latter, the data clock DCLK is used to latch the data in latch 59 which is present in each of the data paths of the DQ data bus.

As noted, an important aspect of the invention is the use of a $2^N$ bit pattern for the synchronization signal. Because the number of bit positions in the repeating pattern is even, the pattern will always synchronize on the same directiongoing edge of the clock signal CCLK or DCLK, e.g., the positive-going edge, which removes ambiguity and simplifies the control logic circuit 21.

Figures 6, 7:
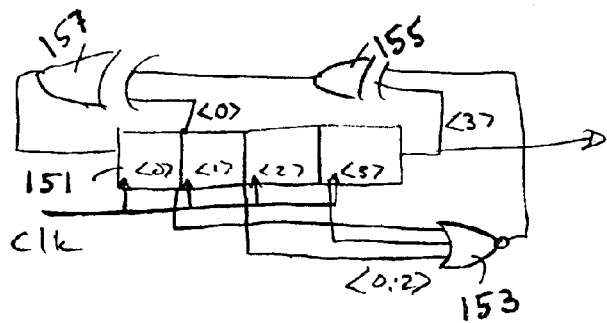
FIG. 6 is a representative circuit for generating a $2^N$ 16-bit code used in the present invention.
FIG. 7 illustrates all acceptable delay values for synchronization under various possible cross talk conditions.

A circuit for generating the $2^N$ bit pattern, where N=4, to produce a repeating 16 bit pattern, is illustrated in FIG. 6. It includes a four stage shift register 151 having bit positions <0><1><2><3>, NOR gate 153 having three inputs respectively connected to the <0><1><2> outputs of shift register 151, an exclusive OR gate 155 having two inputs respectively connected to the output <3> of shift register 151 and the output of NOR gate 153, and an exclusive OR gate 157 having a pair of inputs respectively connected to the output of exclusive OR gate 155 and the first stage output <0> of shift register 151. The output of exclusive OR gate 157 is applied as an input to stage <0> of shift register 151. The clock signal CLK is applied to shift register 151. The shift register 151 can initially be seeded with all zeroes "0" at stages <0><1><2><3> and it will generate the repeating 16 bit pattern "1111010110010000." This pattern is similar to the 15-bit pseudo random pattern described above, but includes an additional bit, e.g. a "0" added to the 15-bit pattern. In lieu of generating the repeating bit pattern with a circuit, the pattern can also be stored in the memory controller 13 (FIG. 1) and repeatedly read out during calibration.

The calibration of one data path as described above can also be performed with in phase and out of phase cross talk components applied to adjacent data pins and/or data paths. In this manner, calibration can be obtained under conditions which more closely replicate conditions of actual use. Thus, for example, when a particular data path, e.g., FLAG, is being calibrated with the $2^N$ bit synchronization pattern, the same pattern can be applied to adjacent data pins and/or paths, e.g., an adjacent path of the CA0-9 bus, in phase and/or out of phase.

As an example, when the data table of FIG. 5 is being constructed, adjacent data paths to the data path being calibrated, e.g., FLAG, may be fed, in phase, the same $2^N$ bit calibration synchronizing pattern, so that calibration is determined in the presence of in phase cross talk in adjacent data paths. Thereafter, the calibration process can be repeated for the path under calibration, e.g., FLAG, with adjacent data paths receiving an out of phase $2^N$ bit calibration pattern so that calibration is determined in the presence of out of phase cross talk on adjacent pins and/or data paths It is also possible to feed an in phase calibration signal to one adjacent data path and out of phase calibration signal to another adjacent data path to the one under calibration. Yet other possibilities are to apply in phase and out of phase calibration signals alternatively to all other data paths except the one currently under calibration. In all these possibilities for driving the other data paths, the control logic circuit 21 develops a table of the type shown in FIG. 5 showing which delays produce acceptable time alignments of the data on the path being calibrated with the clock signal (CCLK or DCLK as appropriate).

FIG. 7 shows one such exemplary set of tables for calibration of a given data path, e.g., FLAG, under conditions of (A) in phase calibration signals applied to all other data paths; (B) out of phase calibration signals applied to all other data paths; and (C) alternating in phase and out of phase calibration signals applied to all other data paths. Once the control logic circuit 21 has developed the calibration tables for a given data path, e.g., FLAG, under the various possibilities of applying in phase and out of phase calibration patterns to other data paths, it will select a final delay value for the ring delay, e.g., ring delay 29 for the FLAG data path, which best represents a ring delay value in the center of each of the developed tables. In the example shown in the tables of FIG. 6, the selected value would likely be $D_5$ or $D_6$ which is in the delay range of each of the tables and is closest to the center of the delay for all tables. The selected delay is one which will provide adequate time alignment under all conditions of the application of in phase and out of phase calibration signals for the other data paths not currently under calibration.

It is also possible to calibrate several data paths simultaneously using the techniques described above with the remaining data paths not under calibration using in phase and/or out of phase calibration signals. For example, half of the data paths can be designated as "victims" and undergo simultaneous calibration, while the remaining half of the data paths can be designated as noise sources. Calibration would simultaneously occur on the "victim" data paths while the noise source data paths receive alternating in phase and out of phase calibration signals. After calibration of the "victims" the "victim" and "noise source" pins and/or data paths would then be reversed and calibration now carried out on the new "victims" using the other data paths as noise sources as described above.

It is also possible to use the $2^N$ bit calibration pattern of the invention together with a $2^N-1$ bit pattern to calibrate the data paths. With this technique, a table of acceptable delays for each of the bit patterns, similar to that of FIG. 5, is established and the final delay value is selected from a delay value approximately midway of the acceptable delays for both bit patterns.

Figure 8:
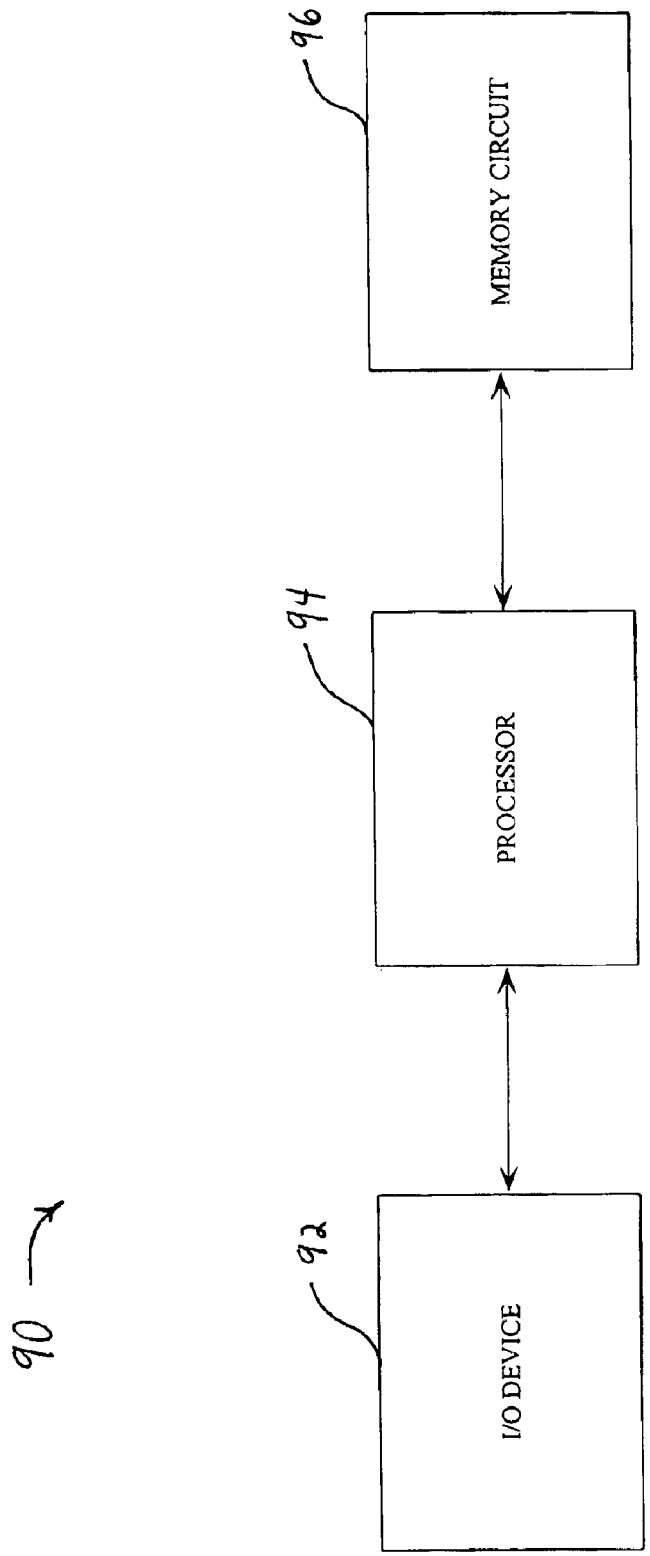
FIG. 8 illustrates a processor based system using an SLDRAM memory which employs calibration structures and process methodologies in accordance with the invention.

An SLDRAM circuit containing the calibration structure and operating as described above may be used in a processor-based system of the type shown in FIG. 8. The processor-based system 90 comprises a processor 94, a memory circuit 96, and an I/O (input/output) device 92. The memory circuit 96 contains a SLDRAM memory circuit containing the calibration structure operating as described in accordance with the present invention. Memory other than SLDRAM may also be used. In addition, the processor 94 may itself be an integrated processor which utilizes on chip memory devices containing the calibration structure of the present invention.

In the preceding discussion, the apparatus and method of the invention has been described with regard to a memory device which clocks data (i.e., reads or writes data) twice per clock cycle: on both the rising and falling edges of the clock. However, the present invention may be used in any memory device in which calibration is performed, including devices which clock data once per clock cycle, for example on one of either the rising or falling edge of the clock.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and desired to be protected by Letters Patent of the United States is:

1. A device comprising:
    a memory;
    an input path for supplying data to said memory; and
    a pattern generator for generating a repeating bit pattern on said input path, said repeating bit pattern having an even number of bits, said pattern generator generating said repeating bit pattern by adding an additional bit to a pseudo random odd number bit pattern.

2. A method of calibrating a digital circuit comprising:
    generating a repeating first calibration pattern for a period of time, said first calibration pattern having an even number of bit positions, said first calibration pattern containing an additional bit added to a pseudo random odd numbered bit pattern;
    applying said first calibration pattern to at least one digital signal path of said digital circuit; and
    using said applied first calibration pattern and a clock signal to adjust a delay element in said at least one signal path to a delay value which produces a reliable detection of said first calibration pattern.

3. A method as in claim 2, further comprising using said clock signal to sample the output of said delay element set to a beginning delay value and determining if said first calibration pattern is reliably detected at a beginning delay value.

4. A method as in claim 3, wherein if said first calibration pattern is not reliably detected, said method further comprising changing said delay element to another delay value and again sampling the output of said delay element and determining if said first calibration pattern is reliably detected.

5. A method as in claim 4, wherein if said first calibration pattern is still not reliably detected, said method further comprises repeating the acts of adjusting the setting of said delay value, sampling and determining until said first calibration pattern is reliably detected.

6. A method as in claim 2, further comprising setting said adjustable delay element to a beginning delay value, sampling the output of said adjustable delay element with said clock signal and determining if said first calibration pattern is reliably detected, and repeating said setting, sampling and determining acts for a plurality of possible delay values to determine which of said delay values produce reliable detection of said first calibration pattern.

7. A method as in claim 6 further comprising choosing as a final setting of said delay value one of said delay values which produces a reliable detection of said calibration pattern.

8. A method as in claim 7, wherein said final setting is chosen as a delay value which is approximately at the center of those delay values which produced a reliable detection of said first calibration pattern.

9. A method as in claim 6, wherein said circuit comprises a plurality of said digital signal paths, and said repeating steps of setting, sampling and determining is performed on each of said plurality of digital signal paths.

10. A method as in claim 6, wherein during said acts of repeatedly setting, sampling and determining for one of said signal paths, said first calibration pattern is simultaneously applied to at least one other of said signal paths.

11. A method as in claim 10, wherein said first calibration pattern applied to said at least one other signal path is applied in phase with respect to said first calibration pattern applied to said at least one signal path.

12. A method as in claim 11, wherein said at least one other signal path is adjacent said at least one signal path.

13. A method as in claim 10, wherein said first calibration pattern applied to said at least one other signal path is applied with inverted phase with respect to said first calibration pattern applied to said at least one signal path.

14. A method as in claim 13, wherein said at least one other signal path is adjacent said at least one signal path.

15. A method as in claim 6, wherein during said acts of repeatedly setting, sampling and determining for one of said signal patterns, said first calibration pattern is simultaneously applied to a plurality of other signal paths.

16. A method as in claim 15, wherein said first calibration pattern which is applied to said plurality of other signal paths is applied to a first plurality of said other signal paths in phase with respect to said first calibration pattern applied to said at least one signal path, and is applied to a second plurality of said other signal paths with inverted phase with respect to said first calibration pattern applied to said at least one signal path.

17. A method as in claim 6, further comprising generating a repeating second calibration pattern, said second calibration pattern being a pseudo random pattern having an odd number of bit positions, setting said adjustable delay element to a beginning delay value, sampling the output of said adjustable delay element with said clock signal, and determining if said second calibration pattern is reliably detected, and repeating said sampling and determining acts for a plurality of possible delay values to determine which of said delay values produce reliable detection of said second calibration pattern.

18. A method as in claim 17, further comprising choosing as a final setting of said delay value one of said delay values which produces a reliable detection of both of said first and second calibration patterns.

19. A method as in claim 18, wherein said final setting is chosen as a delay value which is approximately at the center of those delay values which produce a reliable detection of said first and second calibration patterns.

20. A method as in claim 17, wherein said second calibration pattern is generated by a linear feedback shift register circuit.

21. A method as in claim 2, wherein said circuit is within a semiconductor device.

22. A method as in claim 21, wherein said signal path is a flag signal path.

23. A method as in claim 21, wherein said signal path is a command signal path.

24. A method as in claim 21, wherein said signal path is a data bus signal path.

25. A method as in claim 21, wherein said signal path is an input data line signal path.

26. A method as in claim 21, wherein said calibration method is performed at power-up and reset of said semiconductor device.

27. A method as in claim 2, wherein said calibration pattern is generated by a modified four-bit linear feedback shift register circuit.

28. A method as in claim 2, wherein said calibration pattern is a stored pattern.

29. A method as in claim 2, wherein said clock signal clocks data on at least one of a rising or falling edge of said dock signal.

30. A method as in claim 2, wherein said clock signal clocks data on both rising and falling edges of said clock signal.

31. A digital circuit for calibrating incoming signal paths of a memory circuit, comprising:
- an incoming clock signal path;
- at least one incoming data signal path;
- at least one variable delay circuit, respectively provided in said incoming data signal path;
- at least one latch circuit, respectively coupled to the output of said variable delay circuit, said at least one latch circuit latching data in response to a clock signal on said incoming dock signal path;
- a pattern generation circuit, which generates a repeating bit pattern having an even number of bit positions on said at least one incoming data signal path; and
- a control logic circuit connected to receive an output of said latch circuit and connected to vary the delay of said delay circuit, said control logic circuit analyzing an output of said latch circuit and adjusting the delay of said variable delay circuit to synchronize data on said incoming data signal path with said dock signal.

32. The digital circuit of claim 31 further comprising a comparator circuit which compares said output of said latch circuit with said repeating bit pattern during synchronization of data on said incoming data signal path with said clock signal.

33. The digital circuit of claim 31 wherein said pattern generation circuit is a linear feedback shift register circuit.

34. The digital circuit of claim 31 wherein said pattern generation circuit is a modified four-bit linear feedback shift register circuit.

35. The digital circuit of claim 31 wherein said bit pattern is a stored bit pattern and is repeatedly read out.

36. The digital circuit of claim 31 wherein said bit pattern comprises an additional bit added to a pseudo random odd number bit pattern.

37. The digital circuit of claim 31 wherein said bit pattern is 1111010110010000.

38. The digital circuit of claim 31 further comprising at least one other signal path, wherein said bit pattern is simultaneously applied to said at least one other signal path.

39. The digital circuit of claim 38, wherein said bit pattern applied to said at least one other signal path is applied in phase with respect to said bit pattern applied to said incoming data signal path.

40. The digital circuit of claim 39, wherein said at least one other signal path is adjacent said incoming data signal path.

41. The digital circuit of claim 38, wherein said bit pattern applied to said at least one other signal path is applied with inverted phase with respect to said bit pattern applied to said incoming data signal path.

42. The digital circuit of claim 41, wherein said at least one other signal path is adjacent said incoming data signal path.

43. The digital circuit of claim 31 further comprising a plurality of other signal paths, wherein said bit pattern is simultaneously applied to said other signal paths.

44. The digital circuit of claim 43, wherein said bit pattern which is applied to said plurality of other signal paths is applied to a first plurality of said other signal paths in phase with respect to said bit pattern applied to said incoming data signal path, and is applied to a second plurality of said other signal paths with inverted phase with respect to said bit pattern applied to said incoming data signal path.

45. The digital circuit of claim 31, wherein said clock signal clocks data on at least one of a rising or falling edge of said clock signal.

46. The digital circuit of claim 31, wherein said clock signal clocks data on both rising and falling edges of said clock signal.

47. A semiconductor memory circuit, comprising:
- a memory module;
- a memory controller connected to said memory module; and
- a calibration circuit for calibrating data incoming to said memory module, said calibration circuit comprising:
  - an incoming clock signal path;
  - at least one incoming data signal path;
  - at least one variable delay circuit, respectively provided in said incoming data signal path;

at least one latch circuit, respectively coupled to the output of said variable delay circuit, said at least one latch circuit latching data in response to a clock signal on said incoming clock signal path;

a pattern generation circuit, which generates a repeating bit pattern having an even number of bit positions on said at least one incoming data signal path; and a control logic circuit connected to receive an output of said latch circuit and connected to vary the delay of said delay circuit, said control logic circuit analyzing an output of said latch circuit and adjusting the delay of said variable delay circuit to synchronize data on said incoming data signal path with said clock signal.

48. The memory circuit of claim 47 further comprising a comparator circuit which compares said output of said latch circuit with said repeating bit pattern during synchronization of data on said incoming data signal path with said clock signal.

49. The memory circuit of claim 47 wherein said pattern generation circuit is a linear feedback shift register circuit.

50. The memory circuit of claim 47 wherein said pattern generation circuit is a modified four-bit linear feedback shift register circuit.

51. The memory circuit of claim 47 wherein said bit pattern is a stored bit pattern and is repeatedly read out.

52. The memory circuit of claim 47 wherein said bit pattern comprises an additional bit added to a pseudo random odd number bit pattern.

53. The memory circuit of claim 47 wherein said bit pattern is 111010110010000.

54. The memory circuit of claim 47 further comprising at least one other signal path, wherein said bit pattern is simultaneously applied to said at least one other signal path.

55. The memory circuit of claim 54, wherein said bit pattern applied to said at least one other signal path is applied in phase with respect to said bit pattern applied to said incoming data signal path.

56. The memory circuit of claim 55, wherein said at least one other signal path is adjacent said incoming data signal path.

57. The memory circuit of claim 54, wherein said bit pattern applied to said at least one other signal path is applied with inverted phase with respect to said bit pattern applied to said incoming data signal path.

58. The memory circuit of claim 57, wherein said at least one other signal path is adjacent said incoming data signal path.

59. The memory circuit of claim 47 further comprising a plurality of other signal paths, wherein said bit pattern is simultaneously applied to said other signal paths.

60. The memory circuit of claim 59, wherein said bit pattern which is applied to said plurality of other signal paths is applied to a first plurality of said other signal paths in phase with respect to said bit pattern applied to said incoming data signal path, and is applied to a second plurality of said other signal paths with inverted phase with respect to said bit pattern applied to said incoming data signal path.

61. The memory circuit of claim 47, wherein said clock signal clocks data on at least one of a rising or falling edge of said clock signal.

62. The memory circuit of claim 47, wherein said clock signal clocks data on both rising and falling edges of said clock signal.

63. A processor-based system, comprising:

a processor;

an integrated memory circuit connected to said processor, said integrated memory circuit including a calibration circuit comprising:

an incoming clock signal path;

at least one incoming data signal path;

at least one variable delay circuit, respectively provided in said incoming data signal path;

at least one latch circuit, respectively coupled to the output of said variable delay circuit, said at least one latch circuit latching data in response to a clock signal on said incoming clock signal path;

a pattern generation circuit, which generates a repeating bit pattern having an even number of bit positions on said at least one incoming data signal path; and a control logic circuit connected to receive an output of said latch circuit and connected to vary the delay of said delay circuit, said control logic circuit analyzing an output of said latch circuit and adjusting the delay of said variable delay circuit to synchronize data on said incoming data signal path with said clock signal.

64. The processor-based system of claim 63 further comprising a comparator circuit which compares said output of said latch circuit with said repeating bit pattern during synchronization of data on said incoming data signal path with said clock signal.

65. The processor-based system of claim 63 wherein said pattern generation circuit is a linear feedback shift register circuit.

66. The processor-based system of claim 63 wherein said pattern generation circuit is a modified four-bit linear feedback shift register circuit.

67. The processor-based system of claim 63 wherein said bit pattern is a stored bit pattern and is repeatedly read out.

68. The processor-based system of claim 63 wherein said bit pattern comprises an additional bit added to a pseudo random odd number bit pattern.

69. The processor-based system of claim 63 wherein said bit pattern is 1111010110010000.

70. The processor-based system of claim 63 further comprising at least one other signal path, wherein said bit pattern is simultaneously applied to said at least one other signal path.

71. The processor-based system of claim 70, wherein said bit pattern applied to said at least one other signal path is applied in phase with respect to said bit pattern applied to said incoming data signal path.

72. The processor-based system of claim 71, wherein said at least one other signal path is adjacent said incoming data signal path.

73. The processor-based system of claim 70, wherein said bit pattern applied to said at least one other signal path is applied with inverted phase with respect to said bit pattern applied to said incoming data signal path.

74. The processor-based system of claim 73, wherein said at least one other signal path is adjacent said incoming data signal path.

75. The processor-based system of claim 63 further comprising a plurality of other signal paths, wherein said bit pattern is simultaneously applied to said other signal paths.

76. The processor-based system of claim 75, wherein said bit pattern which is applied to said plurality of other signal paths is applied to a first plurality of said other signal paths in phase with respect to said bit pattern applied to said incoming data signal path, and is applied to a second plurality of said other signal paths with inverted phase with respect to said bit pattern applied to said incoming data signal path.

77. The processor-based system of claim 63, wherein said clock signal clocks data on at least one of a rising or falling edge of said clock signal.

78. The processor-based system of claim 63, wherein said dock signal docks data on both rising and falling edges of said clock signal.

79. An embedded-memory processor-based system, comprising:

a processor;

a memory circuit formed on a same integrated circuit as said processor, said memory circuit including a calibration circuit comprising:

an incoming clock signal path;

at least one incoming data signal path;

at least one variable delay circuit, respectively provided in said incoming data signal path;

at least one latch circuit, respectively coupled to the output of said variable delay circuit, said at least one latch circuit latching data in response to a clock signal on said incoming clock signal path;

a pattern generation circuit, which generates a repeating bit pattern having an even number of bit positions on said at least one incoming data signal path; and a control logic circuit connected to receive an output of said latch circuit and connected to vary the delay of said delay circuit, said control logic circuit analyzing an output of said latch circuit and adjusting the delay of said variable delay circuit to synchronize data on said incoming data signal path with said clock signal.

80. The embedded-memory processor-based system of claim 79 further comprising a comparator circuit which compares said output of said latch circuit with said repeating bit pattern during synchronization of data on said incoming data signal path with said clock signal.

81. The embedded-memory processor-based system of claim 79 wherein said pattern generation circuit is a linear feedback shift register circuit.

82. The embedded-memory processor-based system of claim 79 wherein said pattern generation circuit is a modified four-bit linear feedback shift register circuit.

83. The embedded-memory processor-based system of claim 79 wherein said bit pattern is a stored bit pattern and is repeatedly read out.

84. The embedded-memory processor-based system of claim 79 wherein said bit pattern comprises an additional bit added to a pseudo random odd number bit pattern.

85. The embedded-memory processor-based system of claim 79 wherein said bit pattern is 1111010110010000.

86. The embedded-memory processor-based system of claim 79 further comprising at least one other signal path, wherein said bit pattern is simultaneously applied to said at least one other signal path.

87. The embedded-memory processor-based system of claim 86, wherein said bit pattern applied to said at least one other signal path is applied in phase with respect to said bit pattern applied to said incoming data signal path.

88. The embedded-memory processor-based system of claim 87, wherein said at least one other signal path is adjacent said incoming data signal path.

89. The embedded-memory processor-based system of claim 86, wherein said bit pattern applied to said at least one other signal path is applied with inverted phase with respect to said bit pattern applied to said incoming data signal path.

90. The embedded-memory processor-based system of claim 89, wherein said at least one other signal path is adjacent said incoming data signal path.

91. The embedded-memory processor-based system of claim 79 further comprising a plurality of other signal paths, wherein said bit pattern is simultaneously applied to said other signal paths.

92. The embedded-memory processor-based system of claim 91, wherein said bit pattern which is applied to said plurality of other signal paths is applied to a first plurality of said other signal paths in phase with respect to said bit pattern applied to said incoming data signal path, and is applied to a second plurality of said other signal paths with inverted phase with respect to said bit pattern applied to said incoming data signal path.

93. The embedded-memory processor-based system of claim 79, wherein said clock signal clocks data on at least one of a rising or falling edge of said clock signal.

94. The embedded-memory processor-based system of claim 79, wherein said clock signal clocks data on both rising and falling edges of said clock signal.

* * * * *